United States Patent
Zhang

(10) Patent No.: US 12,205,520 B2
(45) Date of Patent: Jan. 21, 2025

(54) SPLICING SCREEN

(71) Applicant: Wuhan China Star Optoelectronics Semiconductor Display Technology Co., Ltd., Hubei (CN)

(72) Inventor: Le Zhang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/623,625

(22) PCT Filed: Dec. 17, 2021

(86) PCT No.: PCT/CN2021/138980
§ 371 (c)(1),
(2) Date: Jun. 15, 2023

(87) PCT Pub. No.: WO2023/103028
PCT Pub. Date: Jun. 15, 2023

(65) Prior Publication Data
US 2024/0096264 A1    Mar. 21, 2024

(30) Foreign Application Priority Data
Dec. 9, 2021    (CN) .......................... 202111497517.2

(51) Int. Cl.
*G09G 3/32* (2016.01)
*H01L 25/075* (2006.01)
(Continued)

(52) U.S. Cl.
CPC ........... *G09G 3/32* (2013.01); *H01L 25/0753* (2013.01); *H01L 25/167* (2013.01); *H01L 33/62* (2013.01);
(Continued)

(58) Field of Classification Search
CPC ............... G09G 3/32; G09G 2300/026; G09G 2310/0267; G09G 2310/0275; G09G 3/20;
(Continued)

(56) References Cited

U.S. PATENT DOCUMENTS 7,119,787 B2 * 10/2006 Yamaguchi ............ G09G 3/344
345/103
9,947,739 B2 * 4/2018 Song .................... H10K 59/131
(Continued)

FOREIGN PATENT DOCUMENTS

CN        204463727        7/2015
CN        105093729        11/2015
(Continued)

OTHER PUBLICATIONS

International Search Report and the Written Opinion Dated Sep. 7, 2022 From the International Searching Authority Re. Application No. PCT/CN2021/138980 and Its Translation Into English. (16 Pages).
(Continued)

*Primary Examiner* — Grant Sitta

(57) ABSTRACT

A splicing screen includes a connecting plate and two sub-displays. The sub-display screens include gate signal lines, data lines, and first pads, each of which is electrically connected to a data line or a gate signal line. The connecting plate is arranged on one side of the sub-display screen facing away from a light-emitting side thereof. Two first pads connected to the data lines or gate signal lines of two sub-display screens that are spliced are connected in pair by the connecting plate. By utilizing pads and the connection plate to achieve a communication between the signal lines in the sub-display screens without needing, a drive circuit at an edge of each sub-display screen, a width of the non-display area at the splicing slit is reduced. The first pads are provided
(Continued)

at one side of the sub-display screen facing the connecting plate, which reduces the width of the splicing slit.

19 Claims, 9 Drawing Sheets

(51) Int. Cl.
*H01L 25/16* (2023.01)
*H01L 33/62* (2010.01)

(52) U.S. Cl.
CPC ............ *G09G 2300/026* (2013.01); *G09G 2310/0267* (2013.01); *G09G 2310/0275* (2013.01)

(58) Field of Classification Search
CPC ... H01L 25/0753; H01L 25/167; H01L 33/62; H01L 24/08; G09F 9/3026
See application file for complete search history.

(56) References Cited

U.S. PATENT DOCUMENTS

| | | | |
|---|---|---|---|
| 10,210,832 B2* | 2/2019 | Ma | H05K 1/147 |
| 11,373,584 B2* | 6/2022 | Zhao | G11C 19/28 |
| 2007/0091059 A1* | 4/2007 | Kang | G09G 3/342 |
| | | | 345/102 |
| 2010/0053127 A1* | 3/2010 | Takenaka | G02F 1/13452 |
| | | | 345/204 |
| 2010/0277440 A1 | 11/2010 | Cok | |
| 2018/0173036 A1* | 6/2018 | Kim | G02F 1/133524 |
| 2019/0019443 A1* | 1/2019 | Shi | G06F 3/1446 |
| 2020/0111391 A1* | 4/2020 | Chao | H01L 25/0753 |
| 2020/0111771 A1* | 4/2020 | Su | H01L 25/167 |
| 2020/0211929 A1* | 7/2020 | Son | G09F 9/3026 |
| 2021/0066538 A1 | 3/2021 | Liu et al. | |
| 2021/0125566 A1 | 4/2021 | Yang | |
| 2021/0193067 A1 | 6/2021 | Shao et al. | |
| 2022/0077270 A1* | 3/2022 | Kim | H10K 71/00 |

FOREIGN PATENT DOCUMENTS

| | | |
|---|---|---|
| CN | 110504282 | 11/2019 |
| CN | 110797472 | 2/2020 |
| CN | 110828489 | 2/2020 |
| CN | 112419980 | 2/2021 |
| CN | 112820766 | 5/2021 |
| CN | 113219729 | 8/2021 |
| CN | 113593478 | 11/2021 |
| CN | 215008219 | 12/2021 |

OTHER PUBLICATIONS

Notification of Decision of Rejection Dated Jun. 16, 2022 From the State Intellectual Property Office of the People's Republic of China Re. Application No. 202111497517.2 and Its Translation Into English. (15 Pages).

Notification of Office Action and Search Report Dated Jun. 16, 2022 From the State Intellectual Property Office of the People's Republic of China Re. Application No. 202111497517.2 and Its Translation Into English. (24 Pages).

Notification of Office Action and Search Report Dated Nov. 22, 2022 From the State Intellectual Property Office of the People's Republic of China Re. Application No. 202111497517.2 and Its Translation Into English. (15 Pages).

* cited by examiner

SPLICING SCREEN

RELATED APPLICATIONS

This application is a National Phase of PCT Patent Application No. PCT/CN2021/138980 having International filing date of Dec. 17, 2021, which claims the benefit of priority of China Patent Application No. 202111497517.2 filed on Dec. 9, 2021. The contents of the above applications are all incorporated by reference as if fully set forth herein in their entirety.

FIELD AND BACKGROUND OF THE INVENTION

The present disclosure relates to the field of display technology, in particular to a splicing screen.

A splicing screen refers to a display screen formed by splicing small-size sub-display screens. The existing splicing screen inevitably produces a splicing slit between the splicing sub-display screens and cannot do a display at the splicing slit. Furthermore, because each splicing sub-display screen needs integrated circuit to do control, it is necessary to bond integrated circuits, flexible circuit boards or flip chip films on the edge of the spliced sub-display screen, which will occupy a certain area to form a bonding area. The bonding area cannot do display normally, and thus increases a width of a non-display area between the spliced sub-display screens.

SUMMARY OF THE INVENTION

In view of the above problems, the present disclosure provides a new splicing screen to reduce a width of a non-display area between the spliced sub-display screens in the art. The technical scheme provided by the present disclosure is as follows.

According to the present disclosure, the present application provides a splicing screen, the splicing screen comprises a connecting plate and at least two sub-display screens. Each of the sub-display screens comprises a plurality of gate signal lines extending in a first direction and a plurality of data lines extending in a second direction. The gate signal line and the data line are intersected. One side of the sub-display screen facing the connecting plate is further provided with a plurality of first pads, and each of the first pads is electrically connected to one of the data lines or the gate signal lines. The connecting plate is arranged on one side of the sub-display screens facing away from a light-emitting side thereof. Two of the first pads connected to the data lines of two sub-display screens that are spliced are connected in pair by the connecting plate, and/or two of the first pads respectively connected to the gate signal lines of the two sub-display screens that are spliced are electrically connected in pair by the connecting plate.

Further, each of the sub-display screens comprises at least one splicing edge that is spliced with an adjacent sub-display screens, and the first pads are disposed close to the splicing edge and arranged along the splicing edge.

Further, each of the sub-display screens further comprises a plurality of sub-pixel units, and the first pads are provided between the sub-pixel units and the splicing edge.

Further, each of the sub-display screens further comprises a plurality of sub-pixel units, and in a place near the splicing edge, the first pads are staggered with the sub-pixel units such that one first pad is located between two adjacent sub-pixel units.

Further, the splicing screen comprises a first non-display area and two second non-display areas, the two second non-display areas are located at edge areas on two opposite sides of the splicing screen, and the first non-display area is located in an edge area on the other side of the splicing screen, the first non-display area is located between the two second non-display areas. The splicing screen further comprises a driving chip and two gate driving circuits. The driving chip is set in the first non-display area and connected to the two gate driving circuits and the data lines, for inputting gate driving signals to the gate driving circuits and inputting source driving signals to the data lines. The two gate driving circuits are respectively arranged in the two second non-display areas, and connected to the gate signal lines for transmitting scanning signals to the gate signal lines.

Further, the gate driving circuit is an integration of multi-stage driving units or gate-level driving chips, for driving the gate signal lines.

Further, the sub-display screens are spliced in an M*N array, wherein M and N are both positive integers, each of the sub-display screens in the first column and the M-th column includes a third non-display area, and the N third non-display areas located in the first column collectively constitute one of the second non-display areas, the N third non-display areas located in the M-th column collectively constitute another one of the second non-display areas; and each of the gate driving circuits comprises N sub-gate driving circuits, and each of the sub-gate driving circuits is set in one corresponding third non-display area, the driving chip is connected to the sub-gate driving circuit.

Further, the driver chip is electrically connected to the sub-gate driving circuits respectively in the first sub-display screen in the first column and the first sub-display screen in the M-th column; the sub-display screens in the first and the M-th columns further include second pads, and the second pads are provided on the side of the sub-display screen facing the connecting plate, and connected to the sub-gate driving circuit in the corresponding sub-display screen; and two second pads respectively connected to two adjacent sub-gate driving circuits are electrically connected together through the connecting plate, so as to respectively connect the N sub-gate driving circuits located in the first column and the N sub-gate driving circuits in the M-th column in series.

Further, the sub-display screens are spliced in an M*N array, where M and N are both positive integers; the M sub-display screens in the first row include fourth non-display areas, and the M fourth non-display areas collectively constitute the first non-display area; the driving chip comprises M sub-chips, each of the sub-chips is respectively arranged in one corresponding fourth non-display area; the M sub-display screens in the first row further include second pads, the second pads are provided on the side of the corresponding sub-display screen facing the connecting plate, and connected to the sub-chip in the corresponding sub-display screen; and two second pads respectively connected to two adjacent sub-chips are electrically connected together through the connecting plate, so as to connect the M sub-chips located in the first row in series.

Further, each of the sub-display screens comprises a substrate and a pixel driving circuit layer provided on the substrate, the first pads are provided on the side of the substrate facing the connecting plate, and the first pads are electrically connected to the gate signal lines and/or the data signal lines through the pixel driving circuit layer.

Further, the pixel driving circuit layer comprises an active layer, a gate insulating layer, a gate layer, an interlayer insulating layer, and a first metal layer provided on the substrate, the first metal layer comprises a first lead, and the first pad is electrically connected to the gate signal line and/or the data line through the first lead.

Further, the sub-display screen further comprises a light-emitting structure layer, and the light-emitting structure layer is provided on one side of the pixel driving circuit facing away from the substrate, the light-emitting structure layer comprises a plurality of light-emitting units, the pixel driving circuit layer comprises a plurality of driving TFTs, the gate of the driving TFT is provided on the gate layer, the source and drain of the driving TFT are provided on the first metal layer, and the source of the driving TFT is electrically connected to an anode of a corresponding light-emitting unit.

Further, he projection of the first pad on the substrate is within the projection of a part of the light-emitting unit on the substrate.

Further, the sub-display screen further comprises a second metal layer, the second metal layer is provided between the pixel driving circuit layer and the light emitting structure layer, the second metal layer comprises a second lead, and at least part of the anode of the light-emitting unit is electrically connected to the source of the driving TFT through the second lead.

Further, the sub-display screen further comprises a buffer layer and a flatten layer, the buffer layer is provided between the substrate and the pixel driving circuit layer, and the flatten layer is arranged between the pixel driving circuit layer and the light-emitting structure layer.

Further, the connecting plate is provided with third pads, and in two of the sub-display screens spliced with each other, two of the first pads that are respectively connected to the data lines and/or the gate signal lines are electrically connected through the third pad.

Further, the first pad and the third pad are crimped and bonded by a conductive materials.

Further, a side surface of the first pad facing the connecting plate and a side surface of the substrate facing away from the pixel driving circuit layer are co-planar.

Further, the substrate comprises a first sub-substrate and a second sub-substrate, the second sub-substrate is located between the first sub-substrate and the pixel driving circuit layer, the first pad is provided on one side of the second sub-substrate facing the first sub-substrate, one side surface of the first pad facing the connecting plate is co-planar with one side surface of the second sub-substrate facing the first sub-substrate, the first sub-substrate is provided with a hole, the hole is provided corresponding to the first pad, and the conductive material fills the hole for electricity connecting the first pad and the third pad.

Further, the sub-display screen further comprises a through hole, the through hole penetrates the pixel driving circuit layer, the first pad is arranged corresponding to the through hole, and the first lead is partially deposited in the through hole to electrically connect the first pad.

The beneficial effects of the present disclosure comprise: the splicing screen of the present disclosure uses the pads and the connecting plate to realize a connection between the signal lines (gate signal lines and/or data lines) in the sub-display screens that are spliced with each other, so that there is no need to set a driving circuit at an edge of each sub-display screen, which in turn effectively reduces a width of the non-display area at the splicing slit. At the same time, in the splicing screen of the present disclosure, the first pads are provided at one side of the sub-display screen facing the connecting plate. In comparison to a way of using additional metal lines in the splicing slit to achieve connections of signal lines in the sub-display screens that are spliced together, the present invention reduces the width of the splicing slit and thus reduces a width of the non-display area at the splicing slit.

BRIEF DESCRIPTION OF THE SEVERAL VIEWS OF THE DRAWINGS

In order to more clearly illustrate the technical solutions according to the embodiment of the present disclosure, the followings will briefly introduce the drawings that need to be used in the description of the embodiments. Obviously, the following drawings in the description are only some embodiments of the present disclosure. For those skilled in the art, other drawings can be obtained based on these drawings without creative work.

DESCRIPTION OF SPECIFIC EMBODIMENTS OF THE INVENTION

Figure 1:
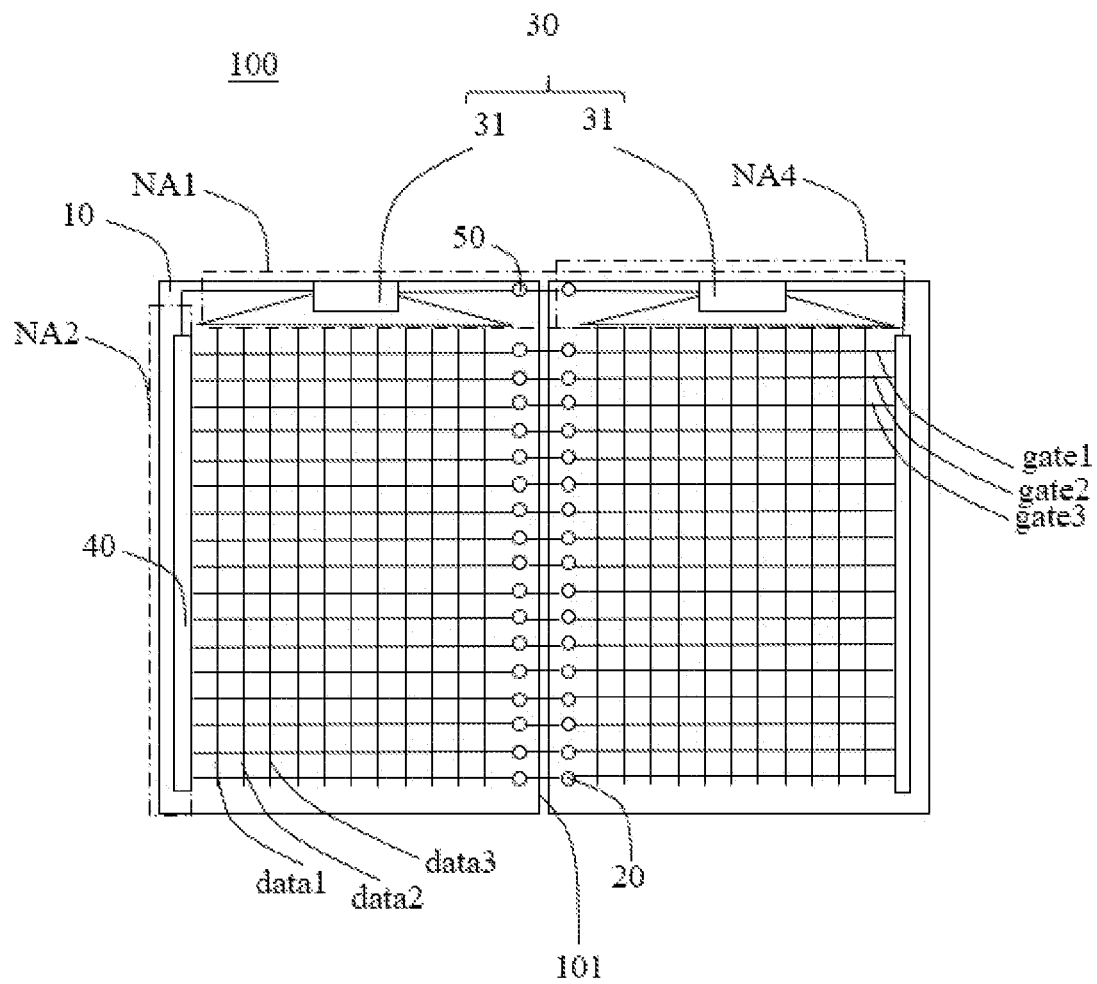
FIG. 1 is a schematic diagram showing a plan view of a splicing screen according to a first embodiment of the present disclosure.

The followings will clearly and completely describe the technical solutions in the embodiments of the present disclosure in conjunction with the accompanying drawings in the embodiments of the present disclosure. Obviously, the described embodiments are only part of the embodiments of the present disclosure, not all of the embodiments. Based on the embodiments in the present disclosure, all other embodiments obtained by those skilled in the art without creative work belong to the protection of the present disclosure scope. In addition, it should be understood that the specific embodiments described here are only used to illustrate and explain the present disclosure, not to limit the present disclosure. In the present disclosure, if there is no explanation to the contrary, the orientation words used such as "up" and "down" generally refer to the upper and lower positions of the device in actual use or working state, specifically the drawing direction shown in the accompanying drawings. Moreover, "inner" and "outer" refer to the outline of the device.

The present disclosure provides a splicing screen. The splicing screen comprises a connecting plate and at least two sub-display screens. Each of the sub-display screens comprises a plurality of gate signal lines extending in a first direction and a plurality of data lines extending in a second direction, and the gate signal lines and the data lines are intersected respectively. Each of the sub-display screens is provided with a plurality of first pads on one side facing the connecting plate, and each of the first pads is electrically connected to one of the data line and the gate signal line. The connecting plate is mounted on one side of the sub-display screen that faces away from a side of emitting light. The first pads connected to the data lines of the two sub-display screens that are spliced with each other are connected in pair through the connecting plate. The first pads connected to the gate signal lines of the two sub-display screens that are spliced with each other are electrically connected in pair through the connecting plate.

It should be noted that the above-mentioned sub-display screens all have the same number of gate signal lines and data lines.

The splicing screen of the present disclosure utilizes the pads and the connecting plate to realize the connection between the signal lines (gate signal lines and/or data lines) of the sub-display screens that are spliced with each other, so that there is no need to provide driving circuits at an edge of each sub-display screen, which in turn effectively reduces the width of a non-display area at a splicing slit. At the same time, in the splicing screen of the present disclosure, the first pads are arranged on one side of the sub-display screen facing the connecting plate, the present disclosure further reduces the width of the splicing slit, and thus further reduces the width of the non-display area at the splicing slit, in a comparison to a way of adding metal wires at the splicing slit to realize the connection of the signal lines in the sub-display screens that are spliced with each other.

The specific embodiments of the splicing screen provided by the present disclosure will be described below.

First Embodiment

Figure 2A:
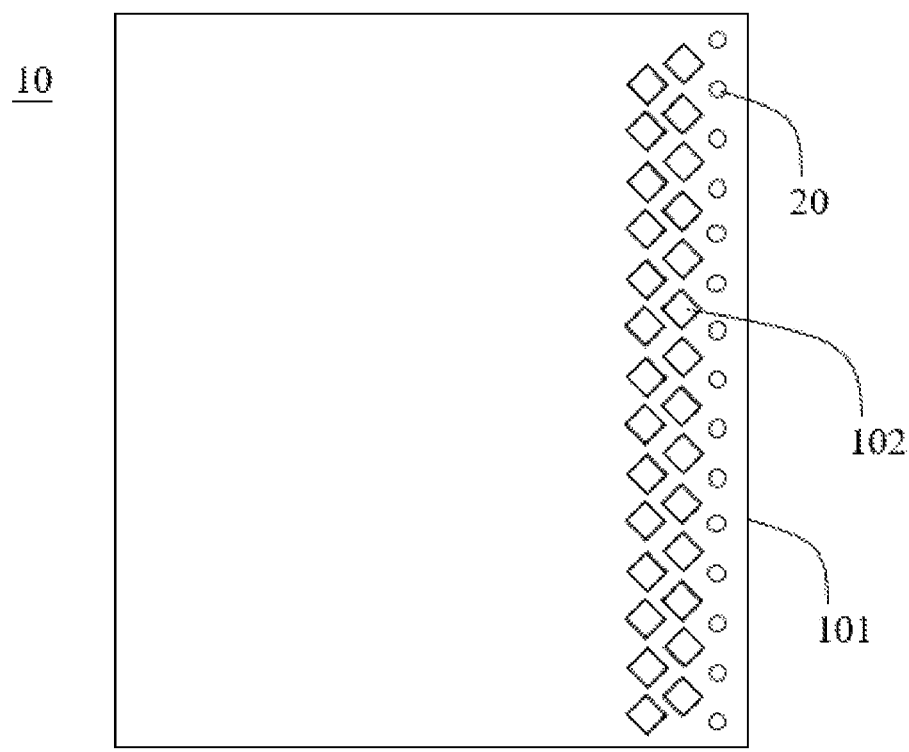
FIG. 2A and FIG. 2B are schematic diagrams showing a distribution of first pads and sub-pixel units in the splicing screen according to one embodiment of the present disclosure.
Figure 2B:
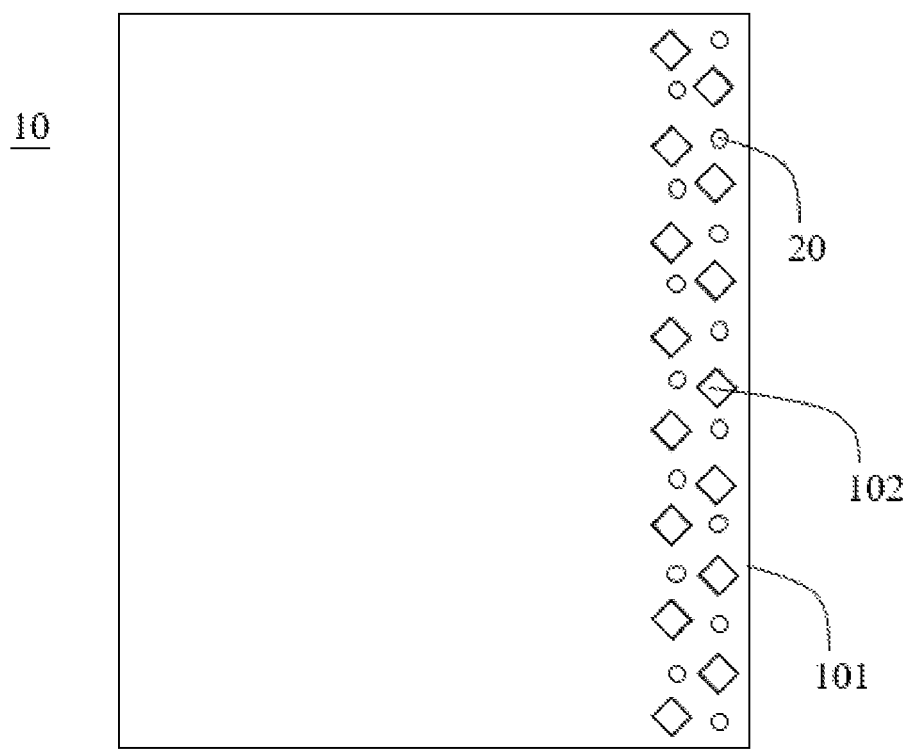
Figure 3:
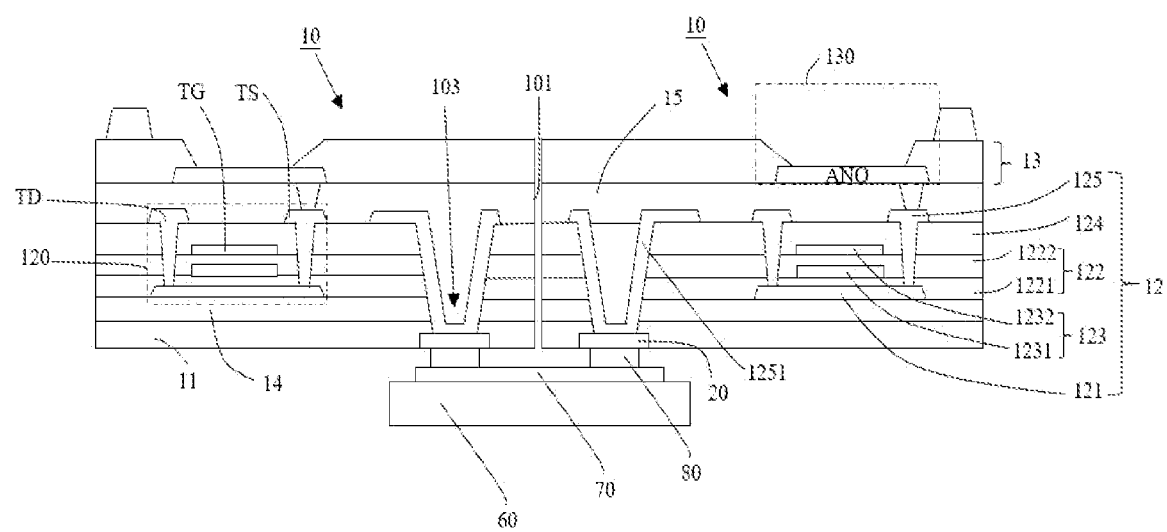
FIG. 3 is a structural schematic diagram showing a structure of two adjacent sub-display screens in the splicing screen according to the first embodiment of the present disclosure.

Please refer to FIG. 1 to FIG. 3. In this embodiment, the splicing screen 100 comprises two sub-display screens 10, and the two sub-display screens 10 are spliced in an array pattern of 1*2 (one row and two columns). That is, the two sub-display screens are spliced in the row direction.

Please refer to FIG. 1, which shows a schematic plan view of a splicing screen according to a first embodiment of the present disclosure. Each of the sub-display screens 10 comprises a splicing edge 101 that is spliced with an adjacent sub-display screens 10. It should be noted that the number of splicing edges 101 of the sub-display screen 10 is equal to the number of other sub-display screens to be spliced. That is, each sub-display screen 10 comprises at least one splicing edge 101 spliced with an adjacent sub-display screen 10. In this embodiment, because there are only two sub-display screens 10, each sub-display screen 10 is only spliced with another sub-display screen 10. Each sub-display screen 10 only comprises one splicing edge 101 that is spliced with the adjacent sub-display screen 10.

The sub-display screen 10 comprises a plurality of gate signal lines extending in a first direction and a plurality of data line data extending in a second direction, and the gate signal line gate and the data line are intersected. From a perspective of user's front view, the gate signal line (gate) and the data line intersect vertically and horizontally, the gate signal line (gate) is the horizontal signal line, and the data line (data) is the vertical signal line. For the convenience of description, the gate signal lines (gate) are defined as gate1, gate2, gate3 . . . from top to bottom, and the data lines (data) are defined as data1, data2, data3 . . . from left to right.

The sub-display screen 10 comprises a plurality of first pads 20, and the first pads 20 are arranged close to the splicing edge 101 and arranged along the splicing edge 101. Each of the first pads 20 is electrically connected to one of the data line (data) or the gate signal line (gate). The first pads 20 connected to the data lines (data) of the two sub-display screens 10 that are spliced to each other are electrically connected in pairs, and/or, the first pads 20 connected to the gate signal line (gate) of the two sub-display screens 10 that are spliced to each other are electrically connected in pairs, so that the connections of the signal lines in the two sub-display screens 10 that are spliced with each other are achieved.

Preferably, at the splicing edge 101 of the two sub-display screens 10 that are spliced with each other, the data line (data) and/or the gate signal line (gate) of one of the sub-display screens 10 are electrically connected to adjacently corresponding data line (data) or adjacently corresponding gate signal line (gate) of the other one of the sub-display screens 10.

Specifically, in this embodiment, the two sub-display screens 10 are spliced in a 1*2 (one row and two columns) array pattern. Thus, the splicing edge 101 of the two sub-display screens 10 is a longitudinally extending edge, and the splicing edge 101 is parallel to the data line (data). The first pads 20 are arranged along the splicing edge 101, and each of the first pads 20 is connected to a corresponding gate signal line (gate). Two adjacent gate signal lines of the two sub-display screens 10 are conducted through two first pads 20. That is, two lines of gate1 are conducted through the two first pads 20 respectively connected to them, two lines of gate2 are conducted through the two first pads 20 respectively connected to them, and two lines of gates3 are conducted through the two first pads 20 respectively connected to them.

Understandably, in other embodiments, in the two sub-display screens 10 that are spliced with each other, the two gate signal lines that are electrically connected to each other may also adopt a jumper connection mode. For example, in two sub-display screens 10 that are spliced with each other, a line of gate1 in one of the sub-display screens 10 is electrically connected to a line of gate3 in the other one of the sub-display screens 10.

The splicing screen 100 also comprises a driving chip 30 and two gate driving circuits 40. The driving chip 30 is arranged in an upper non-display area of the splicing screen 100, and the two gate driving circuits 40 are respectively arranged in the non-display areas on the left and the right sides of the splicing screen 100. The driving chip 30 is connected to two gate driving circuits 40 and the data lines (data), to input gate drive signals to the gate driving circuits 40 and to input source drive signals to the data line (data). The two gate driving circuits 40 are connected to the gate signal lines (gate) for transmitting row scanning signals to the gate signal lines (gate).

Specifically, the splicing screen 100 comprises a first non-display area NA1 and two second non-display areas NA2. The two second non-display areas NA2 are located at two opposite edge areas of the splicing screen 100. The first non-display area NA1 is located at an edge area on the other side of the splicing screen 100, and the first non-display area NA1 is located between the two second non-display areas NA2. The driving chips 30 are all provided in the first non-display area NA1, and the two gate driving circuits 40 are all provided in the two second non-display areas NA2. Specifically, each of the gate driving circuits 40 is arranged in one corresponding second non-display area NA2.

The sub-display screens 10 in the present disclosure are spliced in an M*N array (where M and N are both positive integers). The following describes the driving chip 30 and the gate driving circuit 40 in detail by taking the form of M*N array splicing as example.

The sub-display screen 10 in the first column and the M-th column comprises a third non-display area NA3, and the N third non-display areas NA3 in the first column collectively constitute one of the second non-display areas NA2. The N third non-display areas NA3 in the M-th column collectively constitute another one of the second non-display areas NA2. Each of the gate driving circuits 40 comprises N sub-gate driving circuits 41, and each of the sub-gate driving circuits 41 is arranged in a corresponding third non-display area NA3, and the driving chip 30 is connected to the sub-gate driving circuits 41.

Specifically, the driving chip 30 is electrically connected to the sub-gate driving circuits 41 in the first sub-display screen 10 in the first column and in the first sub-display screen 10 in the M-th column, respectively. The sub-display screens 10 in the first and the M-th columns further comprise second pads 50. The second pads 50 are connected to the sub-gate driving circuits 41 in corresponding sub-display screens 10. Two of second pads 50 respectively connected to two adjacent sub-gate driving circuits 41 are electrically connected so as to connect the N sub-gate driving circuits in the first column in series and to connect the N sub-gate driving circuits 41 in the M-th column in series.

The driving chip 30 may be composed of a single chip or a plurality of sub-chips 31 connected in series. If a series structure of sub-chips 31 is adopted, the number of sub-chips 31 can be equal to the number of columns of the sub-display screens 10. That is, each of the upper edges of the sub-display screens 10 in the first row is provided with a sub-chip 31, and the driving chip 30 is formed by connecting the sub-chips 31 in series. In other embodiments, the number of the sub-chips 31 may also be different from the number of columns of the sub-display screens 10, as long as functional requirements are met.

Specifically, the M sub-display screens 10 in the first row include fourth non-display areas NA4, and the M fourth non-display areas NA4 collectively constitute the first non-display area NA1. The driving chip 30 comprises M sub-chips 31, and each of the sub-chips 31 is respectively provided in a corresponding fourth non-display area NA4.

The M sub-display screens 10 in the first row further include second pads 50 that are respectively connected to the sub-chips 31 in a corresponding sub-display screens 10. Two of the second pads 50 respectively connected to the two adjacent sub-chips 31 are electrically connected so as to connect the M sub-chips 31 in the first row in series.

Specifically, in this embodiment, the sub-display screens 10 are spliced in a 1*2 (one row and two columns) array pattern. Therefore, the driving chip 30 consists of two sub-chips 31 connected in series. The gate driving circuit 40 consists of only one sub-gate driving circuit 41.

It should be noted that in this embodiment, the second pads 50 used to connect the sub-gate driving circuits 41 in series and the second pads 50 used to connect the sub-chips 31 in series have the same structure and function, except that the objects to be connected in series are different.

Preferably, in this embodiment, the structure of the second pad 50 is the same as that of the first pad 20, and the way of mutual connection between the second pads 50 is the same as the way of mutual connection between the first pads 20. The difference between the second pad 50 and the first pad 20 is only in naming so as to distinguish the objects to be connected.

In addition, in this embodiment, the gate driving circuit 40 adopts an integration of multi-level driving units (Gate Driver on Array, GOA) for driving the gate signal lines (gate). Understandably, in other embodiments, the gate driving circuit 40 may also use other circuits to achieve its function.

Please refer to FIG. 2A and FIG. 2B, which respectively show a schematic diagram of the distribution of the first pads and the sub-pixel units in the splicing screen of the present disclosure. Each of the sub-display screens 10 comprises a plurality of sub-pixel units 102. In some embodiments, as shown in FIG. 2A, at a position close to the splicing edge 101, the first pads 20 may be provided between the sub-pixel units 102 and the splicing side 101. In some embodiments, as shown in FIG. 2B, at a position close to the splicing edge 101, the first pads 20 can also stagger with sub-pixel units 102, that is, the first pad 20 can be distributed in a gap between two adjacent sub-pixel units 102. By means of this manner, the size of the display area can be increased, and the size of the non-display area between two adjacent sub-display screens 10 can be further reduced.

Please refer to FIG. 3, which shows a schematic structural diagram of two adjacent sub-display screens in a splicing screen according to a first embodiment of the present disclosure. The splicing screen 100 comprises a connecting plate 60, which is arranged on one side of the sub-display screen 10 that faces away from a side of emitting light. The first pads 20 and the second pads 50 are provided on the side of the sub-display screen 10 facing the connecting plate 60. An electrical connection between two corresponding first pads 20 and an electrical connection between two corresponding second pads 50 are all realized through the connecting plate 60.

Specifically, the sub-display screen 10 comprises a substrate 11 and a pixel driving circuit layer 12 and a light-emitting structure layer 13 provided on the substrate 11. The light-emitting structure layer 13 is provided on one side of the pixel driving circuit layer 12 facing away from the substrate 11 and is connected to the pixel driving circuit layer 12.

The pixel driving circuit layer 12 comprises a plurality of driving TFTs 120. The light-emitting structure layer 13 comprises a plurality of light-emitting units 130. The driving TFT 120 is connected to a corresponding light-emitting unit 130 to drive a corresponding light-emitting unit 130. The driving TFT 120 may adopt a bottom gate structure, a single top gate structure, a double top gate structure, etc., as long as the driving requirements are met.

The pixel driving circuit layer 12 at least comprises an active layer 121, a gate insulating layer 122, a gate layer 123, an interlayer insulating layer 124, and a first metal layer 125 provided on the substrate 11. A gate TG of the driving TFT 120 is provided in the gate layer 123, and a source TS and a drain TD of the driving TFT 120 are provided in the first metal layer 125. The source TS of the driving TFT 120 is electrically connected to an anode ANO of a corresponding light-emitting unit 130.

In this embodiment, the driving TFT 120 adopts a double top gate structure. That is, the gate insulating layer 122 comprises a first gate insulating layer 1221 and a second gate insulating layer 1222. The gate layer 123 comprises a first gate layer 1231 and a second gate layer 1232.

In this embodiment, the sub-display screen 10 further comprises a buffer layer 14 and a flat layer 15. The buffer layer 14 is provided between the substrate 11 and the pixel driving circuit layer 12. The flat layer 15 is provided between the pixel driving circuit layer 12 and the light-emitting structure layer 13.

The first pad 20 and the second pad 50 are provided on the side of the substrate 11 facing the connecting plate 60, and the first pad 20 are electrically connected to the gate signal line (gate) and/or the data line (data) through the pixel driving circuit layer 12. Specifically, the first metal layer 125 further comprises a first lead 1251, and the first pad 20 is electrically connected to the gate signal line (gate) and/or the data line (data) through the first lead 1251. The second pad 50 is electrically connected to a corresponding sub-chip 31 or sub-gate driving circuit 41 through the first lead 1251. In this embodiment, the gate signal line (gate) is led out through the first lead 1251 to be connected to the first pad 20.

Specifically, the side surfaces of the first pad 20 and the second pad 50 facing the connecting plate 60 and the side surface of the substrate 11 facing away from the pixel driving circuit layer 12 are co-planar. The sub-display screen 10 also comprises a through hole 103, the through hole 103 penetrates the pixel driving circuit layer 12. The first pad 20 is provided corresponding to the through hole 103, and the first lead 1251 is partially deposited in the through hole 103 so as to electrically connect the first pad 20.

The connecting plate 60 is provided with a third pad 70. In the two sub-display screens 10 that are spliced with each other, two first pads 20 that are respectively connected to two data lines (data) and/or two gate signal lines to be connected are connected to each other through the third pad 70, and two corresponding second pads 50 are also electrically connected through the third pad 70.

Specifically, the first pad 20 and the third pad 70, as well as the second pad 50 and the third pad 70, are crimped and bonded by a conductive material 80. The conductive material 80 may be silver paste, but is not limited to this, as long as it can make a conductive adhesion of the first pad 20 and the second pad 50 to the third pad 70.

Specifically, other gaps between the sub-display screens 10 and the connecting plate 60 and between the sub-display screen 10 and the sub-display screen 10, except for the gaps between the first pad 20 or the second pad 50 and the third pad 70, can be filled with non-conductive adhesive, so that the spliced sub-display screens 10 becomes a whole body.

It can be understood that the above description of the film layer is not a limitation of the present disclosure. In other embodiments, the film structure of the sub-display screen 10 can also be in other forms, as long as it can meet the requirements for the structure and connection of the first pad 20 and the second pad 50.

Second Embodiment

Figure 4:
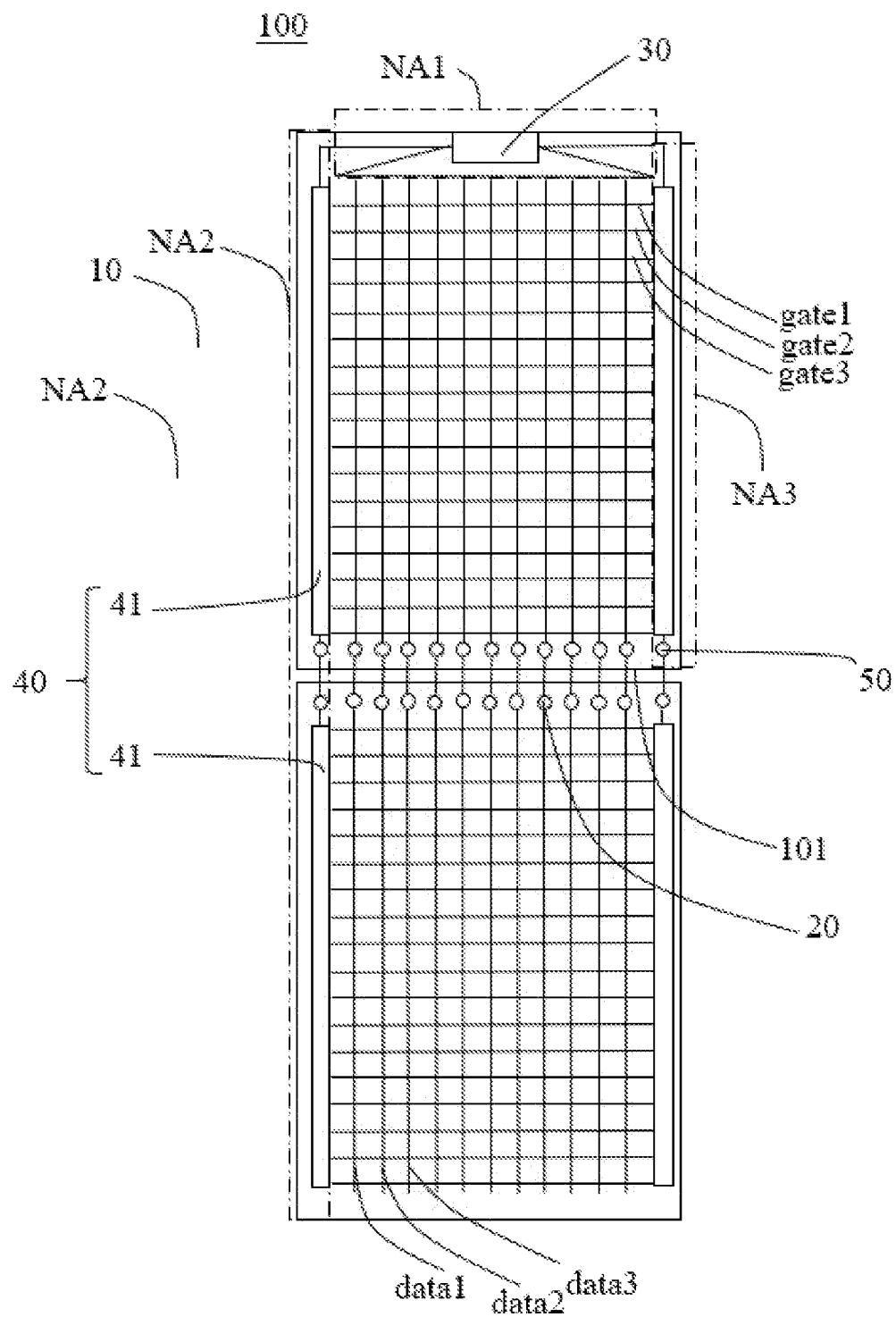
FIG. 4 is a schematic diagram showing a plane view of the splicing screen according to a second embodiment of the present disclosure.

Please refer to FIG. 4, which shows a schematic plan view of the splicing screen according to a second embodiment of the present disclosure. The structure of the splicing screen in this embodiment is similar to the structure of the splicing screen in the first embodiment. The difference between the two embodiments resides in that the splicing screen 100 in this embodiment comprises two sub-display screens 10, and the two sub-display screens 10 are spliced in a 2*1 (two rows and one column) array pattern, that is, the two sub-display screens 10 are spliced in the column direction.

Same as the first embodiment preferably, at the splicing edge 101 of the two sub-display screens 10 spliced with each other, the data lines (data) and/or the gate signal lines (gate) of one sub-display screen 10 are electrically connected to the data lines (data) or the gate signal lines (gate) in another adjacent sub-display screen 10.

Specifically in this embodiment, the splicing edges 101 of the two sub-display screens 10 are laterally extending edges. The splicing edges 101 are parallel to the gate signal lines (gate), and the first pads 20 are distributed along the splicing edges 101. Each of the first pads 20 is connected to a corresponding one of the data lines (data), and two adjacent data lines (data) of two sub-display screens 10 are connected through two first pads 20. That is, two lines of data1 are connected through two first pads 20 respectively connected thereto, two lines of data2 are connected through two first pads 20 respectively connected thereto, and two lines of data3 are connected through two first pads 20 respectively connected thereto.

Understandably, in other embodiments, in the two sub-display screens 10 that are spliced with each other, two data lines that are electrically connected to each other can also adopt a jumper connection mode. For example, in the two sub-display screens 10 that are spliced with each other, the line of data1 in one of the sub-display screens 10 is electrically connected to the line of data3 in another of the sub-display screens 10.

Correspondingly, in this embodiment, the data line (data) is led out through the first lead 1251 to be connected to the first pad 20.

Correspondingly, in this embodiment, the driving chip 30 comprises only one sub-chip 31, and the gate driving circuit 40 consists of two sub-gate driving circuits in series. Either the right side or the left side of each of the two sub-display screens 101 have a third non-display area NA3.

Third Embodiment

Figure 5:
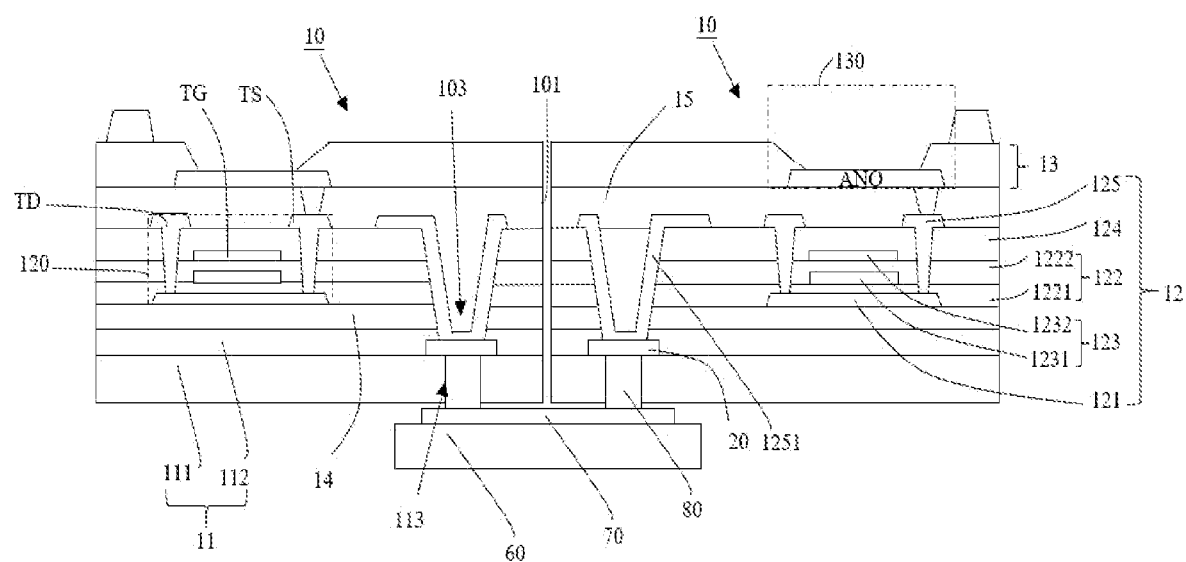
FIG. 5 is a structural schematic diagram showing a structure of two adjacent sub-display screens in the splicing screen according to a third embodiment of the present disclosure.

Please refer to FIG. 5, which shows a schematic structural diagram of two adjacent sub-display screens in the splicing screen according to a third embodiment of the present disclosure. The structure of the sub-display screen in this embodiment is similar to the structure of the sub-display screen in the first embodiment. The difference between this embodiment and the first embodiment resides in that in this embodiment, the substrate 11 comprises a first sub-substrate 111 and a second sub-substrate 112, and the second sub-substrate 112 is located between the first sub-substrate 111 and the pixel driving circuit layer 12. The first pad 20 and the second pad 50 are provided on the side of the second sub-substrate 112 facing the first sub-substrate 111. One side surface of the first pad 20 and one side surface of the second pad 50 facing the connecting plate 60 are co-planar with the side surface of the second sub-substrate 112 facing the first sub-substrate 111. The first sub-substrate 111 is provided with a hole 113, and the hole 113 is provided corresponding to the first pad 20 or the second pad 50. A conductive material 80 fills the hole 113 to electrically connect the first pad 20 and the third pad 70 and to electrically connect the second pad 50 and the third pad 70. The hole 113 can be formed by removing part of the material of the first sub-substrate 111 by laser drilling or the like.

In the manufacturing process of the sub-display screen 10, the sub-display screen shown in the first embodiment can be obtained by peeling the first sub-substrate 111 in this embodiment off by a peeling process. In this embodiment, the substrate 11 retains the mode of the combination of two sub-substrates, and the pads are exposed by laser drilling, so that the peeling process of peeling the first sub-substrate 111 off can be omitted from the manufacturing process.

Fourth Embodiment

Figure 6:
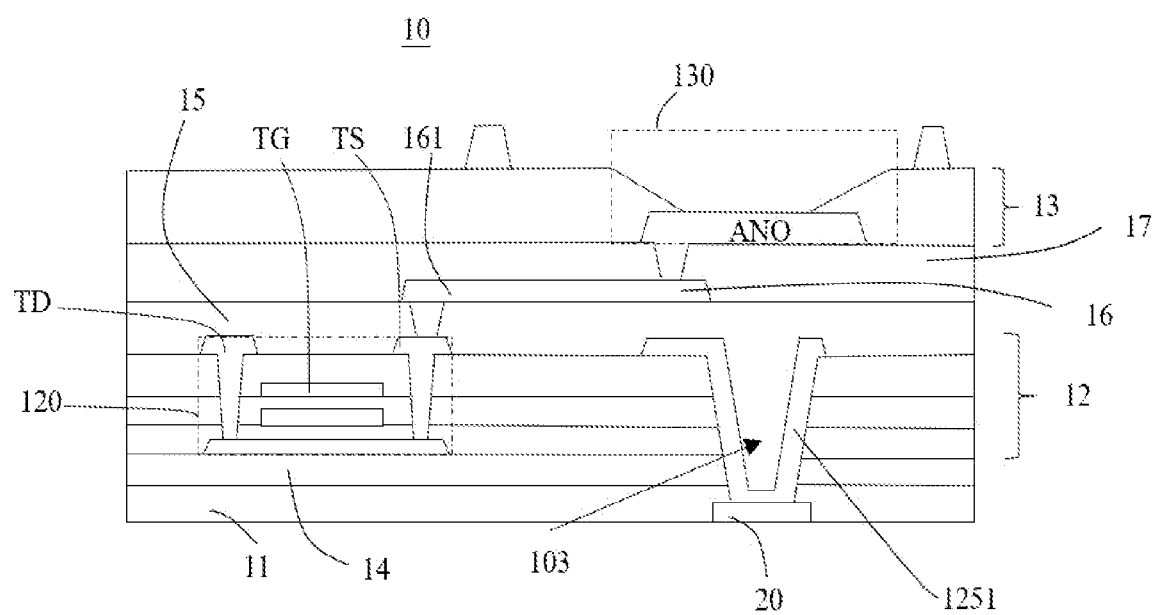
FIG. 6 is a structural schematic diagram showing a structure of a sub-display screen in the splicing screen according to a fourth embodiment of the present disclosure.

Please refer to FIG. 6, which shows a schematic structural diagram of a sub-display screen of a splicing screen in a fourth embodiment of the present disclosure. The structure of the sub-display screen provided in the splicing screen according to this embodiment is similar to the structure of the sub-display screen provided in the splicing screen in the first embodiment. The difference of this embedment from the first embodiment resides in that in this embodiment, the projection of the first pad 20 on the substrate 11 is within the projection of a part of the light-emitting unit 130 on the substrate 11. That is, the light-emitting unit 130 covers the first pad 20 in the direction along the thickness of the sub-display screen 10. In this way, the area above the first pad 20 can also do display to further reduce the size of the non-displayable area.

Furthermore, in this embodiment, the sub-display screen 10 further comprises a second metal layer 16. The second metal layer 16 is provided between the pixel driving circuit layer 12 and the light-emitting structure layer 13. The second metal layer 16 comprises a second lead 161, at least part of the anode electrode ANO of the light-emitting unit 130 is electrically connected to the source electrode TS of the driving TFT 120 through the second lead 161.

Furthermore, in this embodiment, the sub-display screen 10 further comprises a second interlayer insulating layer 17. The second interlayer insulating layer 17 is provided between the second metal layer 16 and the light emitting structure layer 13.

Fifth Embodiment

Figure 7:
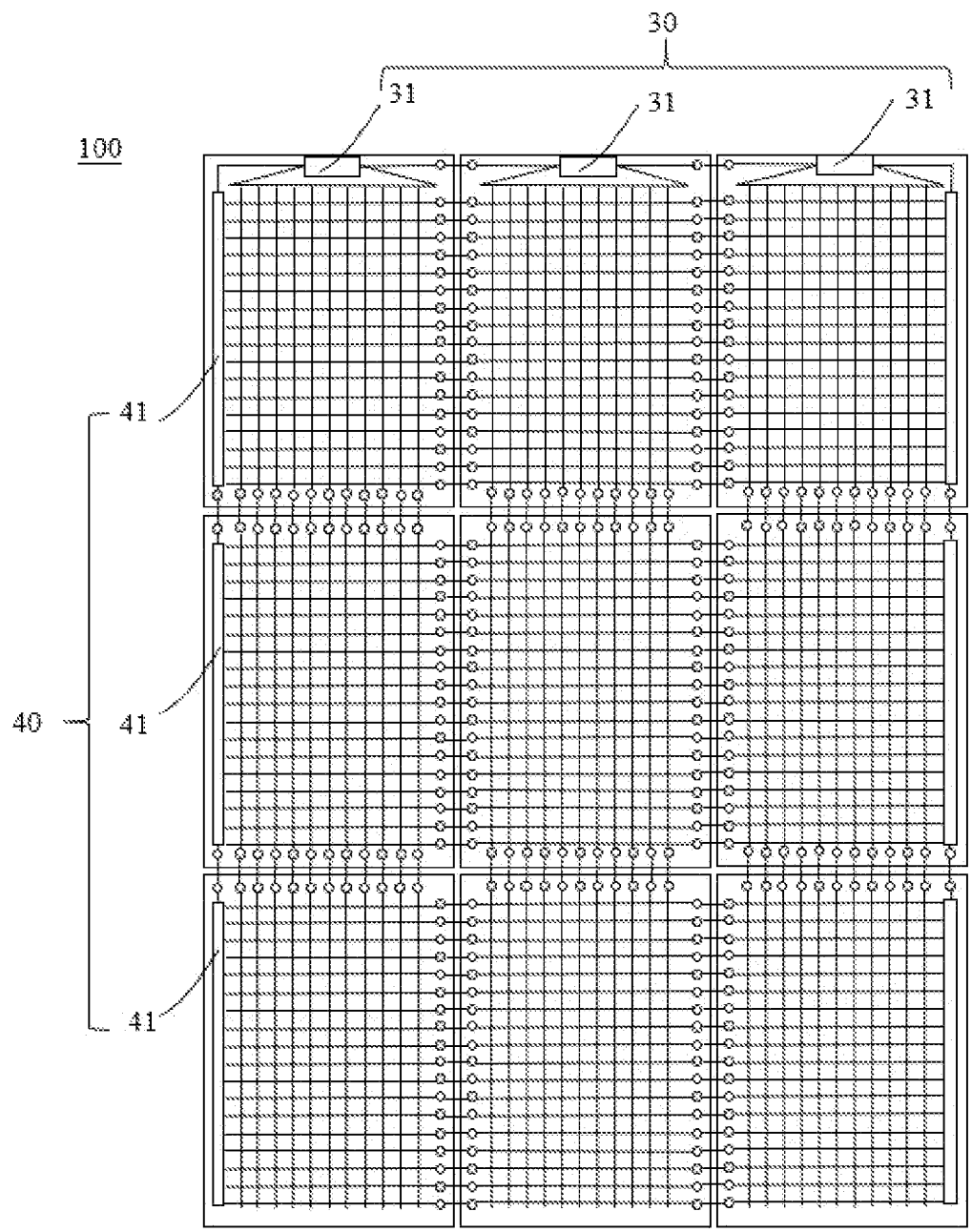
FIG. 7 is a schematic diagram showing a plan view of the splicing screen according to a fifth embodiment of the present disclosure.

Please refer to FIG. 7, which shows a schematic plan view of the splicing screen in the fifth embodiment of the present disclosure. The splicing screen in this embodiment is similar to the splicing screen in the first embodiment, except that in this embodiment the splicing screen 100 comprises nine sub-display screens 10, and the nine sub-display screens 10 are spliced in a 3*3 (three rows and three columns) array pattern.

Correspondingly, in this embodiment, portions of the sub-display screens 10 comprises two splicing edges 101, portion of the sub-display screens 10 comprise three splicing edges 101, and portion of the sub-display screens 10 comprises four splicing edges 101. Thus, the splicing of two adjacent sub-display screens 10 comprises a splicing between laterally extending edges and a splicing between longitudinally extending edges. In this embodiment, the connection between the display signal lines can be referred to the first embodiment and the second embodiment, and thus such a description is not repeated here.

Correspondingly, in this embodiment, the driving chip 30 is composed of three sub-chips 31 connected in series, and the gate driving circuit 40 is composed of three sub-gate driving circuits 41 connected in series. Similarly, the series connection between the sub-chips 31 and the series connection between the sub-gate driving circuits 41 can also refer to the first embodiment and the second embodiment, and thus the details thereof are not repeated here.

Sixth Embodiment

Figure 8:
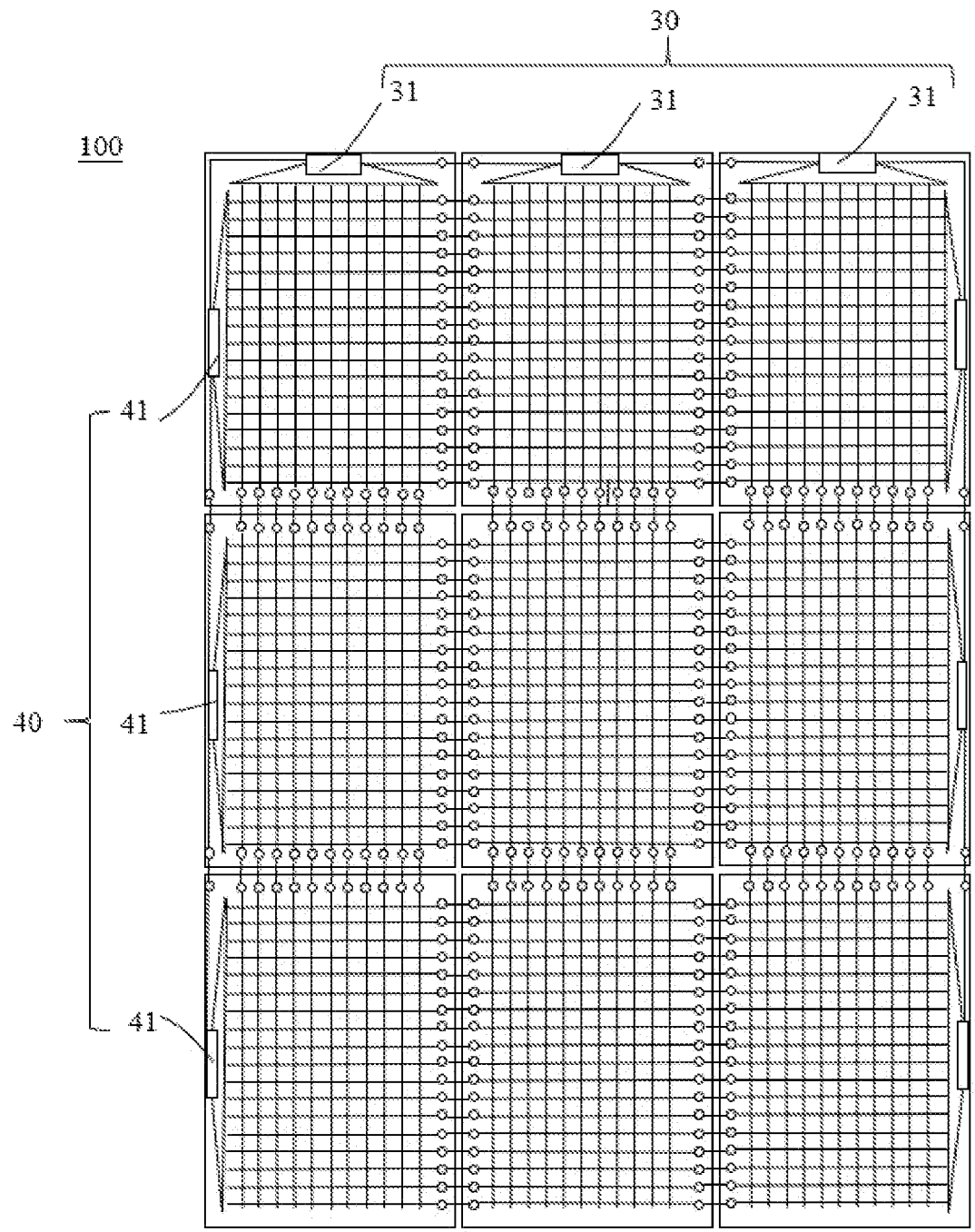
FIG. 8 is a schematic diagram showing a plan view of the splicing screen according to a sixth embodiment of the present disclosure.

Please refer to FIG. 8, which shows a schematic plan view of the splicing screen in a sixth embodiment of the present disclosure. The splicing screen in this embodiment is similar to the splicing screen in the fifth embodiment. The difference between these two embodiments resides in that in this embodiment, the sub-gate driving circuit 41 uses a gate-level driving chip, and the gate driving circuit 40 is an integration of the gate-level driving chips, that is, it consists of multiple gate-level driving chips connected in series.

In summary, although the present disclosure has been disclosed as above by preferred embodiments, it is understandable that various embodiments can be combined arbitrarily, and the above-mentioned preferred embodiments are not intended to limit the present disclosure. Those of ordinary skill in the art can make various changes and modifications without departing from the spirit and scope of the present disclosure. Therefore, the scope of protection of the present disclosure is defined by the claims.

What is claimed is:
1. A splicing screen, comprising:
   a connecting plate; and
   at least two sub-display screens, each of the sub-display screens comprising a plurality of gate signal lines extending in a first direction and a plurality of data lines extending in a second direction, the gate signal line and the data line being intersected, one side of the sub-display screen facing the connecting plate being further provided with a plurality of first pads, and each of the first pads being electrically connected to one of the data lines or the gate signal lines;
   wherein the connecting plate is arranged on one side of the sub-display screens facing away from a light-emitting side thereof; two of the first pads respectively connected to the data lines of two sub-display screens that are spliced are connected in pair by the connecting plate, and/or two of the first pads respectively connected to the gate signal lines of the two sub-display screens that are spliced are electrically connected in pair by the connecting plate,
   wherein the splicing screen comprises a first non-display area and two second non-display areas, the two second non-display areas are located at edge areas on two opposite sides of the splicing screen, the first non-display area is located in an edge area on the other side of the splicing screen, and the first non-display area is located between the two second non-display areas; and
   wherein the splicing screen further comprises a driving chip and two gate driving circuits; the driving chip is set in the first non-display area and connected to the two gate driving circuits and the data lines, for inputting gate driving signals to the gate driving circuits and inputting source driving signals to the data lines; the two gate driving circuits are respectively arranged in the two second non-display areas, and connected to the gate signal lines for transmitting scanning signals to the gate signal lines.
2. The splicing screen according to claim 1, wherein each of the sub-display screens comprises at least one splicing edge spliced with an adjacent sub-display screen, and the first pads are arranged close to the splicing edge and arranged along the splicing edge.

3. The splicing screen according to claim 2, wherein each of the sub-display screens further comprises a plurality of sub-pixel units, and the first pads are provided between the sub-pixel units and the splicing edge.

4. The splicing screen according to claim 2, wherein each of the sub-display screens further comprises a plurality of sub-pixel units, and in a place near the splicing edge, the first pads are staggered with the sub-pixel units such that one first pad is located between two adjacent sub-pixel units.

5. The splicing screen according to claim 1, wherein the gate driving circuit is an integration of multi-stage driving units or gate-level driving chips, for driving the gate signal lines.

6. The splicing screen according to claim 1, wherein the sub-display screens are spliced in an M*N array, where M and N are both positive integers;
- each of the sub-display screens in the first column and the M-th column includes a third non-display area, and N third non-display areas located in the first column collectively constitute one of the second non-display areas, the N third non-display areas located in the M-th column collectively constitute another one of the second non-display areas; and
- each of the gate driving circuits comprises N sub-gate driving circuits, and each of the sub-gate driving circuits is set in one corresponding third non-display area, the driving chip is connected to the sub-gate driving circuit.

7. The splicing screen according to claim 6, wherein the driver chip is electrically connected to the sub-gate driving circuits respectively in the first sub-display screen in the first column and the first sub-display screen in the M-th column;
- the sub-display screens in the first and the M-th columns further include second pads, and the second pads are provided on the side of the sub-display screen facing the connecting plate, and connected to the sub-gate driving circuit in the corresponding sub-display screen; and
- two second pads respectively connected to two adjacent sub-gate driving circuits are electrically connected together through the connecting plate, so as to respectively connect the N sub-gate driving circuits located in the first column and the N sub-gate driving circuits in the M-th column in series.

8. The splicing screen according to claim 1, wherein the sub-display screens are spliced in an M*N array, where M and N are both positive integers;
- the M sub-display screens in the first row include fourth non-display areas, and the M fourth non-display areas collectively constitute the first non-display area;
- the driving chip comprises M sub-chips, each of the sub-chips is respectively arranged in one corresponding fourth non-display area;
- the M sub-display screens in the first row further include second pads, the second pads are provided on the side of the corresponding sub-display screen facing the connecting plate, and connected to the sub-chip in the corresponding sub-display screen; and
- two second pads respectively connected to two adjacent sub-chips are electrically connected together through the connecting plate, so as to connect the M sub-chips located in the first row in series.

9. The splicing screen according to claim 1, wherein each of the sub-display screens comprises a substrate and a pixel driving circuit layer provided on the substrate, the first pads are provided on the side of the substrate facing the connecting plate, and the first pads are electrically connected to the gate signal lines and/or the data signal lines through the pixel driving circuit layer.

10. The splicing screen according to claim 9, wherein the pixel driving circuit layer comprises an active layer, a gate insulating layer, a gate layer, an interlayer insulating layer, and a first metal layer provided on the substrate, the first metal layer comprises a first lead, and the first pad is electrically connected to the gate signal line and/or the data line through the first lead.

11. The splicing screen according to claim 10, wherein the sub-display screen further comprises a light-emitting structure layer, and the light-emitting structure layer is provided on one side of the pixel driving circuit facing away from the substrate, the light-emitting structure layer comprises a plurality of light-emitting units, the pixel driving circuit layer comprises a plurality of driving TFTs, the gate of the driving TFT is provided on the gate layer, the source and drain of the driving TFT are provided on the first metal layer, and the source of the driving TFT is electrically connected to an anode of a corresponding light-emitting unit.

12. The splicing screen according to claim 11, wherein the projection of the first pad on the substrate is within the projection of a part of the light-emitting unit on the substrate.

13. The splicing screen according to claim 12, wherein the sub-display screen further comprises a second metal layer, the second metal layer is provided between the pixel driving circuit layer and the light emitting structure layer, the second metal layer comprises a second lead, and at least part of the anode of the light-emitting unit is electrically connected to the source of the driving TFT through the second lead.

14. The splicing screen according to claim 11, wherein the sub-display screen further comprises a buffer layer and a flatten layer, the buffer layer is provided between the substrate and the pixel driving circuit layer, and the flatten layer is arranged between the pixel driving circuit layer and the light-emitting structure layer.

15. The splicing screen according to claim 10, wherein the connecting plate is provided with third pads, and in two of the sub-display screens spliced with each other, two of the first pads that are respectively connected to the data lines and/or the gate signal lines are electrically connected through the third pad.

16. The splicing screen according to claim 15, wherein the first pad and the third pad are crimped and bonded by a conductive material.

17. The splicing screen according to claim 16, wherein a side surface of the first pad facing the connecting plate and a side surface of the substrate facing away from the pixel driving circuit layer are co-planar.

18. The splicing screen according to claim 16, wherein the substrate comprises a first sub-substrate and a second sub-substrate, the second sub-substrate is located between the first sub-substrate and the pixel driving circuit layer, the first pad is provided on one side of the second sub-substrate facing the first sub-substrate, one side surface of the first pad facing the connecting plate is co-planar with one side surface of the second sub-substrate facing the first sub-substrate, the first sub-substrate is provided with a hole, the hole is provided corresponding to the first pad, and the conductive material fills the hole for electricity connecting the first pad and the third pad.

19. The splicing screen according to claim 17, wherein the sub-display screen further comprises a through hole, the through hole penetrates the pixel driving circuit layer, the first pad is arranged corresponding to the through hole, and the first lead is partially deposited in the through hole to electrically connect the first pad.

* * * * *